US006651582B2

United States Patent
Sakai et al.

(10) Patent No.: US 6,651,582 B2
(45) Date of Patent: Nov. 25, 2003

(54) METHOD AND DEVICE FOR IRRADIATING AN ION BEAM, AND RELATED METHOD AND DEVICE THEREOF

(75) Inventors: Shigeki Sakai, Kyoto (JP); Tadashi Ikejiri, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/987,112

(22) Filed: Nov. 13, 2001

(65) Prior Publication Data

US 2002/0056814 A1 May 16, 2002

(30) Foreign Application Priority Data

Nov. 14, 2000 (JP) ..................... P 2000-346725

(51) Int. Cl.[7] .................... C23C 16/00; C23C 14/00; H01G 37/317
(52) U.S. Cl. .................. 118/723 R; 118/723 ER; 250/492.3; 250/492.2; 204/298.01; 204/298.05
(58) Field of Search .................. 204/298.01, 298.04, 204/298.05, 298.08, 192.1, 192.11; 250/492.3, 492.21, 492.23, 492.2; 118/715, 723 ER, 723 R

(56) References Cited

U.S. PATENT DOCUMENTS 4,419,203 A  12/1983  Harper et al. ........... 204/192 R
5,089,710 A  * 2/1992  Kikuchi et al. .......... 250/492.3
5,343,047 A  * 8/1994  Ono et al. ............. 250/492.21
5,959,305 A  * 9/1999  Mack et al. ........... 250/492.21
6,451,674 B1 * 9/2002  Niwayama et al. ......... 438/516

FOREIGN PATENT DOCUMENTS

EP   0416549   3/1991
GB   2326971   1/1999
GB   2349503   11/2000
JP   10-64477   3/1998

OTHER PUBLICATIONS

British Patent Office Search Report dated Jul. 18, 2002.

* cited by examiner

Primary Examiner—Parviz Hassanzadel
(74) Attorney, Agent, or Firm—Finnegan, Henderson, Farabow, Garrett & Dunner, L.L.P.

(57) ABSTRACT

When ion beam 14 is irradiated onto a substrate 2 to conduct processing such as ion injection, plasma 30 emitted from a plasma generating device 20 is supplied to a portion close to the substrate 2 to suppress electric charging on a substrate surface caused by ion beam irradiation. A ratio of $I_E/I_B$ is kept at a value not lower than 1.8, a ratio of $I_I/I_E$ is kept at a value not lower than 0.07 and not higher than 0.7, wherein $I_B$ is an electric current of the ion beam 14 irradiated onto the substrate 2, $I_I$ is an ion current expressing a quantity of ions in the plasma 30 emitted from the plasma generating device 20, and $I_E$ is an electron current expressing a quantity of electrons in the plasma 30.

3 Claims, 6 Drawing Sheets

METHOD AND DEVICE FOR IRRADIATING AN ION BEAM, AND RELATED METHOD AND DEVICE THEREOF

BACKGROUND OF THE INVENTION

Field of the Invention

The present invention relates to a method and device for irradiating an ion beam which conducts processing such as ion injection by irradiating the ion beam on a substrate. The present invention also relates to a method of manufacturing a semiconductor device by irradiating an ion beam onto a semiconductor substrate. More particularly, the present invention relates to a means for suppressing electric charging (charge-up) on a substrate surface in the case of ion beam irradiation.

FIG. 6 is a schematic side view showing an example of the conventional ion beam irradiation device. concerning a relation between a substrate 2 and an ion beam 14, refer to the plan view of FIG. 2.

This ion beam irradiation device conducts processing such as ion injection as follows. The spot-shaped ion beam 14, which has been drawn out from an ion source (not shown) and subjected to mass separation and acceleration, is irradiated onto the substrate 2 (for example, a semiconductor substrate) held by a holder 16 while it is reciprocatedly scanned in the direction X (for example, in the horizontal direction) by an electric field or magnetic field.

The substrate 2 and the holder 16 are mechanically reciprocatedly scanned in the direction Y (for example, in the vertical direction), which is substantially perpendicular to the direction X, by a holder drive unit 18. By the cooperation (hybrid scanning) of the above mechanical scanning with the scanning of the ion beam 14, the overall surface of the substrate 2 is uniformly irradiated with the ion beam.

On the upstream side of the substrate 2 and the holder 16, there is provided a plasma generating device 20. The plasma generating device 20 generates plasma 30 and supplies it to a portion close to the substrate 2 so that electric charging on the surface of the substrate 2 caused by irradiation of the ion beam 14 can be suppressed.

The plasma generating device 20 generates the plasma 30 in such a manner that gas (for example, xenon gas) introduced into a plasma generating container 22 is subjected to ionization by arc discharge conducted between a filament 26 for emitting thermoelectrons and the plasma generating container 22 which is also used as an anode. In the periphery of the plasma generating container 22, there is provided a magnetic coil 28 for generating, maintaining and transferring the plasma 30.

Filament voltage VF (for example, about 5 V) for heating the filament is impressed upon the filament 26 by a DC filament power source 32. Arc voltage $V_A$ (for example, about 10 V) is impressed upon between a positive electrode side end of the filament 26 and the plasma generating container 22 by a DC arc power source 34.

Further, in this example, there is provided a cylindrical reflector electrode 38 in such a manner that the cylindrical reflector electrode 38 surrounds a region from the plasma generating device 20 to a portion close to the upstream side of the substrate 20. A negative voltage, for example, a negative voltage of −5 V is impressed upon this reflector electrode 38 by a DC reflector power source 40. Accordingly, the reflector electrode 38 pushes back electrons contained in the plasma 30, which have been emitted from the plasma generating device 20, to the center (that is, to a portion close to the route of the ion beam 14).

An ammeter 36 is connected between a connecting section 33, in which the filament power source 32 and the arc power source 34 are connected with each other, and the ground. It is possible for the ammeter 36 to measure plasma emitting current $I_P$ flowing between the plasma generating device 20 and the ground when the plasma 30 is emitted from the plasma generating device 20.

When the ion beam 14 is irradiated onto the substrate 2, a surface of the substrate 2 is positively charged by the positive electrical charge of the ion beam 14. Especially when the surface of the substrate 2 is made of insulating material, the surface of the substrate 2 tends to be electrically charged. When the plasma 30 is supplied to a portion close to the substrate 2 in the case of ion beam irradiation, electrons contained in the plasma 30 are drawn onto the substrate surface which is positively charged, so that the positive electric charge is neutralized. When the positive electric charge is neutralized, drawing of electrons onto the substrate 2 is automatically stopped. In this way, it becomes possible to suppress the substrate surface from being positively charged when the substrate surface is irradiated with the ion beam.

When the plasma generating device 20 is provided as described above, it becomes possible to somewhat suppress the substrate surface from being electrically charged when it is irradiated with the ion beam. However, it is difficult to completely suppress the substrate surface from being electrically charged when it is irradiated with the ion beam.

The reason is described as follows. Electrons in the plasma 30 emitted from the plasma generating device 20 have an energy distribution, which is called Maxwell-Boltzmann's Distribution, for example, shown in FIG. 7. In this distribution, there is a peak in a portion of 2 to 3 eV; however, it contains electrons having energy, the intensity of which is much higher than that (for example, 10 to 20 eV). Therefore, the electrons, the intensity of which is much higher than that, are supplied onto the substrate 2, and the substrate 2 is negatively charged on the contrary. When the above electrons, the intensity of which is high, is supplied to the substrate 2, the charging voltage of the substrate surface is increased to a voltage corresponding to energy of the electrons concerned.

For the reasons described above, it was impossible to sufficiently suppress the substrate surface from being electrically charged by the prior art. For example, it was a limit to suppress the charging voltage of the substrate surface to be in a range from 10 to 12 V.

However, recently, there has been a strong demand of decreasing the charging voltage of the substrate surface by more suppressing the electrical charging of the substrate surface.

For example, in the case where a semiconductor device is manufactured by ion injection conducted by irradiating an ion beam, there is a demand that the charging voltage is suppressed to be a value not higher than 6 V in the case of ion injection in order to prevent the occurrence of electric breakdown because the structure of a semiconductor device is has become fine recently.

This will be described in detail referring to an example in which a semiconductor device 12 shown in FIG. 8 is manufactured. The semiconductor device is an example of FET (field effect transistor). More particularly, the semiconductor device is an example of MOSFET (MOS type field effect transistor). In the case where the semiconductor device 12 is manufactured, a semiconductor substrate (for example, the silicon substrate) 2 is used as the above substrate 2, a gate oxide film 4 and an oxide film 6 for separation are formed in a predetermined region on the surface of the semiconductor substrate, and a gate electrode 8 is formed on a surface of the gate oxide film 4.

When the semiconductor substrate 2 is irradiated with the ion beam 14, dopant ions (for example, ions of boron, phosphorus or arsenic) are injected. Due to the foregoing, two impurity injection layers 10 are formed in the surface layers of the semiconductor substrate 2 on both sides of the gate electrode 8 and the gate oxide film 4. For example, when ions of boron are injected as the dopant ions, these impurity injection layers 10 become the p-type, and when ions of phosphorus or arsenic are injected as the dopant ions, these impurity injection layers 10 become the n-type. For example, when the semiconductor substrate 2 is of the n-type, the pn-type joint is formed by injecting the p-type impurity layers 10, and one impurity injection layer 10 becomes a source and the other impurity injection layer becomes a drain. Therefore, the p-channel type MOSFET is formed as the semiconductor device 12. For example, when the semiconductor substrate 2 is of the p-type, the pn-type joint is formed by injecting the n-type impurity layers 10. Therefore, the n-channel type MOSFET is formed as the semiconductor device 12. A large number of semiconductor devices 12 described above are formed on the surface of the semiconductor substrate 2.

For the above reasons, when the ion beam 14 is irradiated, electric charge is accumulated on the surface of the gate electrode 8. When the charge voltage exceeds the withstanding voltage of the gate oxide film 4, electric breakdown of the gate oxide film 4 is caused, and the semiconductor device 12 becomes defective.

Recently, size L of one piece of the semiconductor device 12 becomes very small, that is, size L of one piece of the semiconductor device 12 is approximately 0.1 $\mu$m. Accordingly, thickness of the gate oxide film 4 becomes small, that is, thickness of the gate oxide film 4 is approximately 4 nm, and its withstanding voltage is approximately 6 V. For the above reasons, it is necessary to suppress the charging voltage of the gate electrode 8 to be a value not higher than 6 V during the irradiation of the ion beam 14. It is difficult to accomplish this by the prior art described before.

SUMMARY OF THE INVENTION

It is an object of the present invention to suppress electric charging of a substrate surface to be low during the irradiation of ion beams.

The above-mentioned object can be achieved by an ion beam irradiation method, according to the present invention,. which suppresses electric charging on a substrate surface caused by ion beam irradiation by supplying plasma, which has been emitted from a plasma generating device, to a portion close to the substrate when ion beams are irradiated onto the substrate, the method comprising the steps of: keeping a ratio of $I_E/I_B$ at a value not lower than 1.8; and keeping a ratio of $I_I/I_E$ in a range from a value not lower than 0.07 to not higher than 0.7, wherein $I_B$ is an electric current of the ion beam irradiated onto the substrate, $I_I$ is an ion current expressing a quantity of ions in the plasma emitted from the plasma generating device, and $I_E$ is an electron current expressing a quantity of electrons in the plasma.

According to the invention, when the two ratios ($I_E/I_B$ and $I_I/I_E$) are kept in the above ranges, the positive electric charge on the substrate surface, which has been given by the ion beam irradiation, can be effectively neutralized by electrons in the plasma, and the negative electric charging caused by the electrons can be successfully neutralized by ions in the plasma. Accordingly, it is possible to reduce the electric charging of the substrate surface, so that the charging voltage on the substrate surface can be decreased.

The present inventors made various experiments. As a result, they found the following.

In order to effectively suppress electrical charging of a substrate surface which is caused in the process of ion beam irradiation, it is necessary to increase a quantity of electrons contained in plasma emitted from a plasma generating device more than a quantity of ion beams irradiated onto the substrate.

Even if electrons having energy, the intensity of which is high as described above, are contained in the plasma emitted from the plasma generating device, when a ratio of ions (positive ions) contained in the plasma is appropriately increased, the negative electric charge on the substrate surface can be successfully neutralized. Thereforef the practical charging voltage on the substrate surface can be reduced.

When the above two conditions are totalized, the following can be concluded. When the ion beam is irradiated onto the substrate, the above ratio $I_E/I_B$ is kept at a value not lower than 1.8 and the above ratio $I_I/I_E$ is kept in a range from a value not lower than 0.07 to a value not higher than 0.7, the electric charge on the substrate surface can be reduced. Due to the foregoing, it is possible to suppress the electric charging voltage on the substrate surface to be a value not higher than 6 V.

When the above ratio $I_E/I_B$ is lower than 1.8, a quantity of electrons supplied onto the substrate is so small that the substrate surface is positively charged, which is not preferable.

When the above ratio $I_I/I_E$ is lower than 0.07, a quantity of electrons supplied onto the substrate is so large that the substrate surface is negatively charged. On the contrary, when the above ratio $I_I/I_E$ is higher than 0.7, a quantity of ions supplied onto the substrate is so large that the substrate surface is positively charged. Accordingly, either of them is not preferable.

The above-mentioned object can be also achieved by an ion beam irradiation device for conducting processing on a substrate by irradiating an ion beam onto the substrate, according to the present invention, which suppresses electric charging on a substrate surface caused by ion beam irradiation by supplying plasma, which has been emitted from a plasma generating device, to a portion close to the substrate, the device comprising a control unit for keeping a ratio of $I_E/I_B$ at a value not lower than 1.8 and also keeping a ratio of $I_I/I_E$ in a range from a value not lower than 0.07 to not higher than 0.7, wherein $I_B$ is an electric current of the ion beam irradiated onto the substrate, $I_I$ is an ion current expressing a quantity of ions in the plasma emitted from the plasma generating device, and $I_E$ is an electron current expressing a quantity of electrons in the plasma.

According to the invention, it becomes possible to save labor necessary for operating the device and also it becomes possible to automatize the operation.

Further, the above-mentioned object can be achieved by a method of manufacturing a semiconductor device, according to the present invention, which suppresses electric charging on a semiconductor substrate surface caused by ion beam irradiation by supplying plasma, which has been emitted from a plasma generating device, to a portion close to the semiconductor substrate when ion beams are irradiated onto the semiconductor substrate so as to manufacture the semiconductor device, the method comprising the steps of: keeping a ratio of $I_E/I_B$ at a value not lower than 1.8; and keeping a ratio of $I_I/I_E$ a range from a value not lower than 0.07 to not higher than 0.7, wherein $I_B$ is an electric current of the ion beam irradiated onto the substrate, $I_I$ is an ion current expressing a quantity of ions in the plasma emitted from the plasma generating device, and $I_E$ is an electron current expressing a quantity of electrons in the plasma.

According to the invention, it is possible to reduce the electric charging of the substrate surface, so that the charging voltage on the substrate surface can be decreased when the semiconductor device is manufactured. Therefore, it becomes possible to prevent the occurrence of electric breakdown in the process of ion beam irradiation, and the yield of the semiconductor device can be enhanced in the process of manufacturing the semiconductor device. This method is capable of complying with the reduction of the size of the semiconductor device.

DESCRIPTION OF THE PREFERRED EMBODIMENTS

Figure 1:
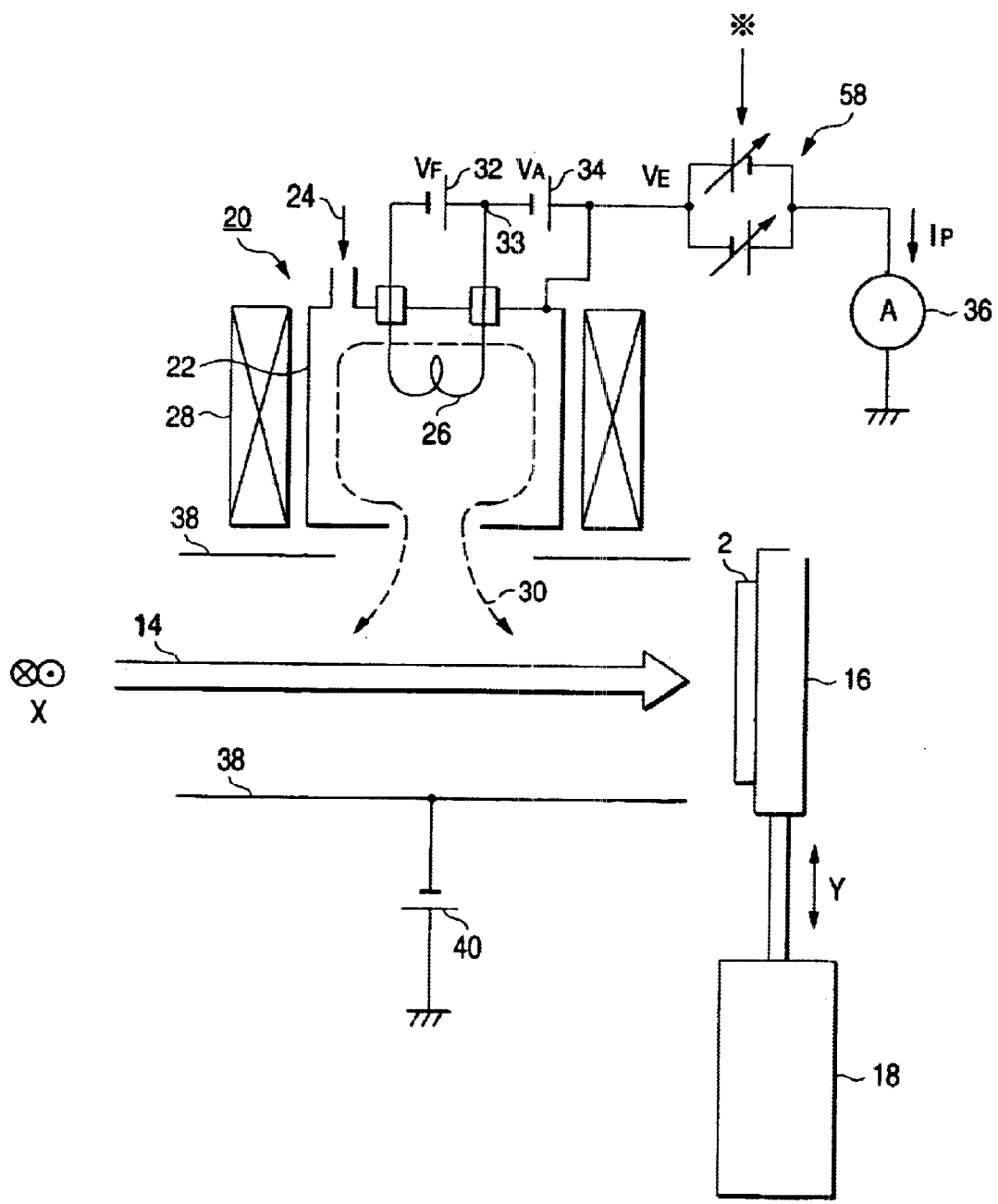
FIG. 1 is a schematic side view showing an example of the ion beam irradiating device to execute the ion beam irradiating method of the present invention.
Figure 2:
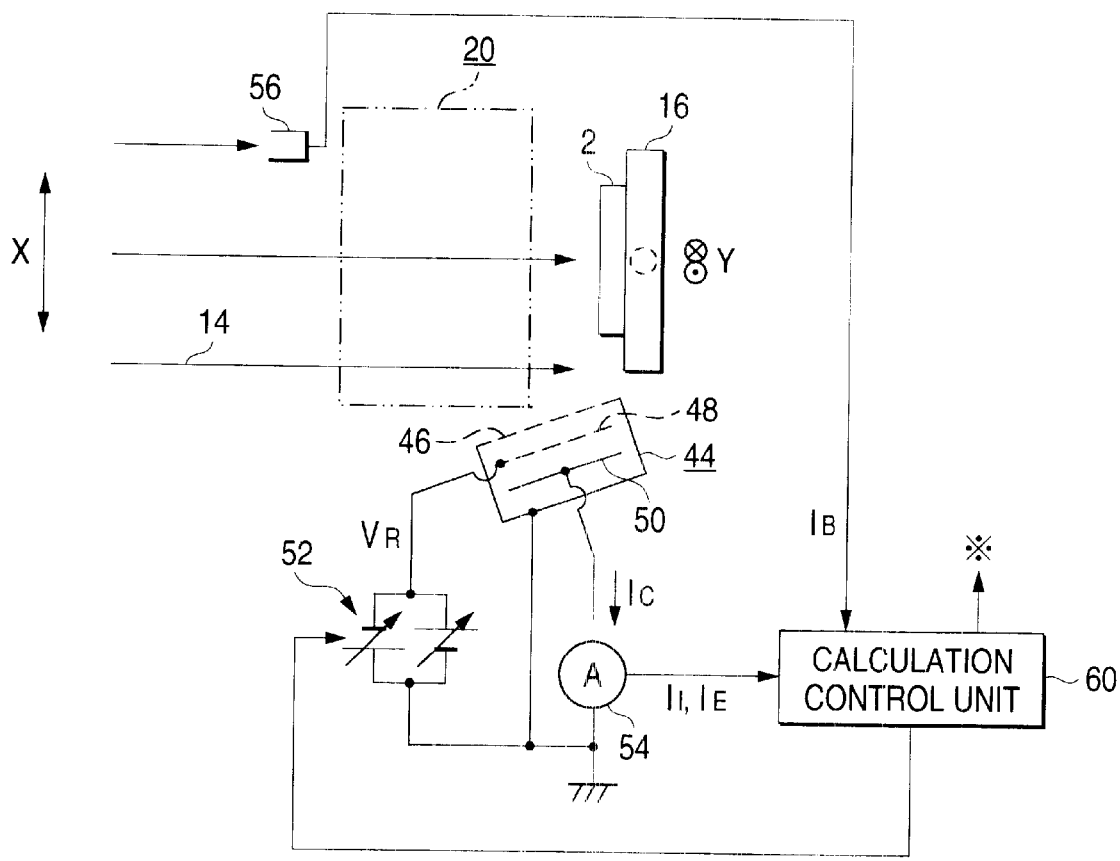
FIG. 2 is a schematic plan view showing the periphery of a substrate of the device shown in FIG. 1.

FIG. 1 is a schematic side view showing an example of the ion beam irradiating device to execute the ion beam irradiating method of the present invention. FIG. 2 is a schematic plan view showing the periphery of a substrate of the device shown in FIG. 1. Like reference characters are used to indicate like parts in various view of FIGS. 1 and 2 and FIG. 6 in which a conventional example is shown. Only different points from the conventional example are explained as follows.

First, referring to FIG. 1, in the ion beam irradiating device, the ammeter 36 is connected between the plasma generating container 22 of the plasma generating device 20 and the ground via a DC drawing power source 58. The intensity and polarity of output voltage of the drawing power source 58 are variable. Therefore, it is possible for the drawing power source 58 to impress positive or negative drawing voltage $V_E$ upon the plasma generating container 22.

According to the intensity and polarity of. drawing voltage $V_E$ outputted from the drawing power source 58, quantities of ions and electrons in the plasma 30 emitted from the plasma generating device 20 can be controlled. For example, when the drawing voltage $V_E$ is made to be positive, the electric potential of the plasma generating container 22 becomes positive. Therefore, ions can be easily emitted from the plasma generating container 22 (On the contrary, it becomes difficult for electrons to be emitted.). Therefore, a quantity of ions in the plasma 30 is increased. When the drawing voltage $V_E$ is increased onto the positive side, the quantity of ions in the plasma 30 is more increased. On the contrary, when the drawing voltage $V_E$ is made to be negative, the electric potential of the plasma generating container 22 becomes negative. Therefore, electrons can be easily emitted from the plasma generating container 22 (On the contrary, it becomes difficult for ions to be emitted.). Therefore, a quantity of electrons in the plasma 30 is increased. When this drawing voltage $V_E$ is increased onto the negative side, the quantity of electrons in the plasma 30 are more increased.

The plasma emitting current $I_P$ measured by the ammeter 36 is an electric current corresponding to a difference between the quantity of ions and the quantity of electrons in the emitted plasma 30.

In this example, as shown in FIG. 2, the quantity of ions and the quantity of electrons in the plasma 30 emitted from the plasma generating device 20 can be measured by an energy analyzer 44 arranged close to the substrate 2 at a position upon which the plasma 30 emitted from the plasma generating device 20 is incident.

The energy analyzer 44 is composed in such a manner that a porous reflecting electrode 48 is arranged behind a porous grounding electrode 46 and that a sheet-shaped collector electrode 50 is arranged behind the porous reflecting electrode 48. The positive or negative reflecting voltage $V_R$ is impressed upon the reflecting electrode 48 from a reflecting power source 52, the intensity and polarity of the output voltage of which are variable. When ions or electrons in the plasma 30 are incident upon the collector electrode 50, collector current $I_C$ flowing in the collector electrode 50 can be measured by an ammeter 54.

Figure 3:
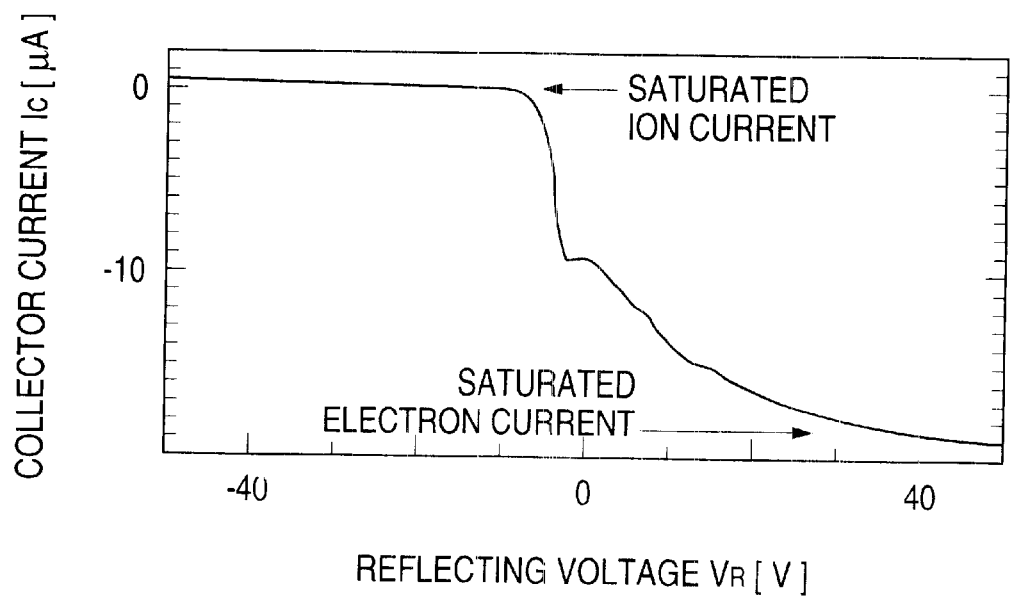
FIG. 3 is a graph showing an example of the relation between the reflecting voltage and the collector current in the energy analyzer shown in FIG. 2.

An example of the relation between the reflecting voltage $V_R$ and the collector current $I_C$ is shown in FIG. 3. The higher the reflecting voltage $V_R$ is made on the negative side, the larger the quantity of ions, which are drawn from the plasma 30 into the energy analyzer 44 by the negative electric potential, are increased. When the reflecting voltage $V_R$ reaches a certain value (for example, −40 V), the collector current $I_C$ is saturated. At this time, this collector current $I_C$ expresses a quantity of ions contained in the plasma 30. This is referred to as a saturation ion current, the abbreviation of which is an ion current. This is the ion current $I_I$ described before.

On the contrary, the higher the reflecting voltage $V_R$ is made on the positive side, the larger the quantity of electrons, which are drawn from the plasma 30 into the energy analyzer 44 by the positive electric potential, are increased. When the reflecting voltage $V_R$ reaches a certain value (for example, +40 V), the collector current $I_C$ is saturated. At this time, the collector current $I_C$ expresses a quantity of electrons contained in the plasma 30. This is referred to as a saturation electron current, the abbreviation of which is an electron current. This is the electron current $I_E$ described before.

In this way, the quantity of ions in the plasma 30 emitted from the plasma generating device 20 can be quantitatively measured. More specifically, the ion current $I_I$ expressing the quantity of ions in the plasma 30 can be quantitatively measured. The quantity of electrons in the plasma 30 can be quantitatively measured. More specifically, the electron current $I_E$ expressing the quantity of electrons in the plasma 30 can be quantitatively measured.

As shown in FIG. 2, in this example, the ion beam current $I_B$ of the ion beam 14 irradiated onto the substrate 2 can be measured by a Faraday cup 56 arranged close to the upstream side of the plasma generating device 20 at a position upon which the ion beam 14 scanning in the direction X is incident.

The ratio $I_E/I_B$ of the electron current $I_E$ with respect to the ion beam current $I_B$ and the ratio $I_I/I_E$ of the ion current $I_I$ with respect to the electron current $I_E$ were variously changed by the above means, and the circumstances of electric charging of the surface of the substrate 2 were measured.

These circumstances of electric charging were measured as follows. A test element group (TEG) was used in which a large number of semiconductor elements for testing were formed on the surface of a semiconductor substrate. Instead of the aforementioned substrate 2, TEG was attached to the holder 16. The TEG was irradiated with the ion beam 14 while supplied with the plasma 30, and then the ratio of existence of the TEG concerned (that is, the ratio of elements remaining in a normal condition) was measured. In this case, the following measurement conditions were used. For the ion beam 14, ions of phosphorus (P), the energy of which was 70 keV, were used. While this ion beam current $I_B$ was being kept at 1 mA, ion injection was conducted upon TEG by the quantity of dose of $5 \times 10^{14}$ cm$^{-2}$. In this case, the withstanding voltage of the TEG composing element was 6 V. An example of the result of this measurement is shown in FIG. 4.

Figure 4:
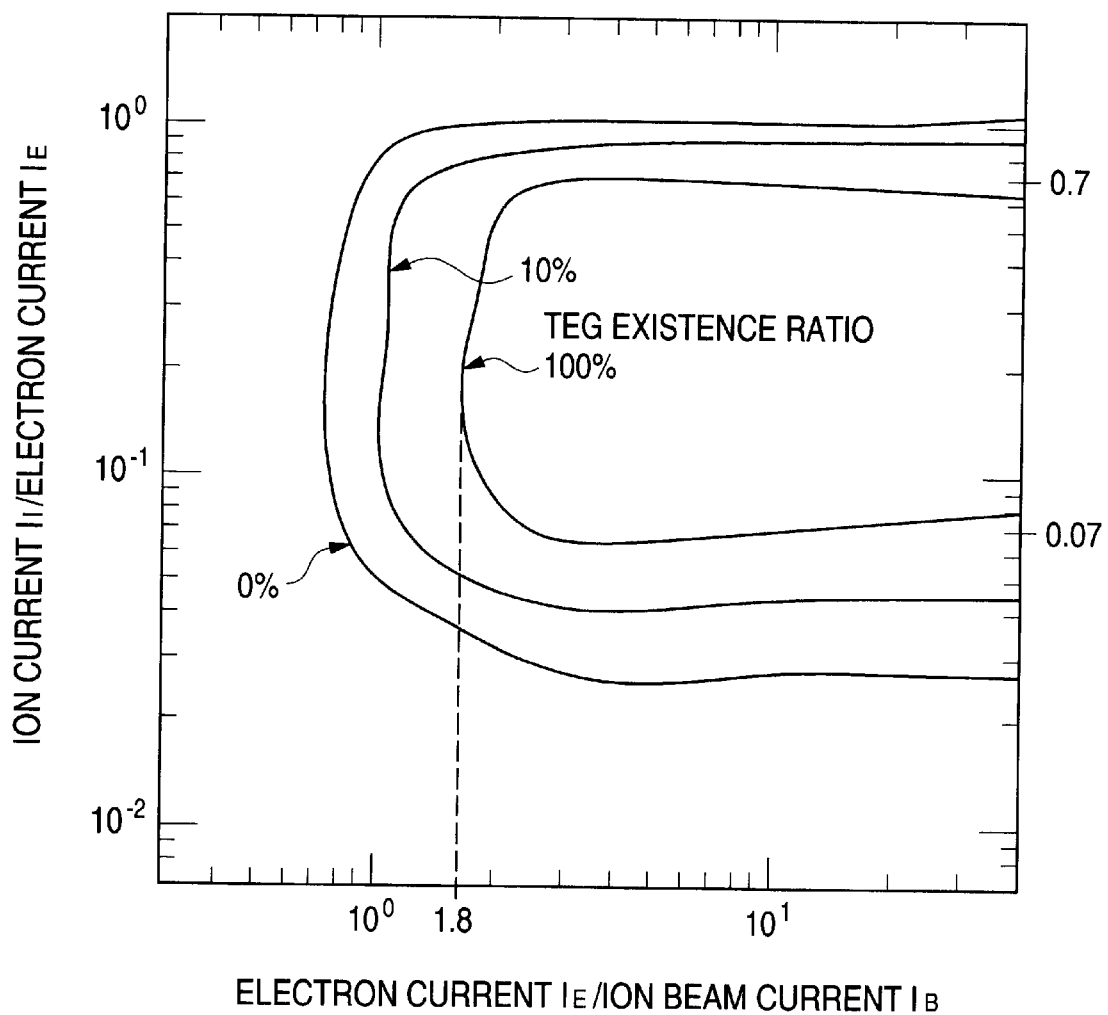
FIG. 4 is a graph showing an example of the result of the measurement in which the existence ratio of the test element group (TEG) is measured.

As shown in FIG. 4, when the ratio $I_E/I_B$ was kept at a value not lower than 1.8 and the ratio $I_I/I_E$ was kept in a range from a value not lower than 0.07 to a value not higher than 0.7, it was possible to keep the ratio of existence of TEG at 100%. In FIG. 4, the ratio of existence is 100% on the line of 100% and in the region surrounded by the line concerned. In order to stay on the safety side, the ratio $I_E/I_B$ may be kept at a value not lower than 2.0, and the ratio $I_I/I_E$ may be kept in a range from a value not lower than 0.08 to a value not higher than 0.6. Due to the foregoing, the ratio of existence of TEG can be positively kept at 100%.

The reason why the above result was provided is that when the ratios $I_E/I_B$ and $I_I/I_E$ are kept in the above ranges, electric charging on the substrate surface can be reduced and the charging voltage of the substrate surface can be decreased. That is, in this example, the charging voltage of the substrate surface was reduced at a value not higher than 6 V which is the withstanding voltage of the TEG composing element.

A control means for controlling the ratios $I_E/I_B$ and $I_I/I_E$ to be in the above ranges may be provided. If such a control means is provided, it becomes possible to save labor necessary for operating the device and also it becomes possible to automatize the operation. In this example, the aforementioned drawing power source 58 and a calculation controlling unit 60 for controlling it compose the control means.

The calculation controlling means 60 controls the reflecting voltage $V_R$, which is outputted from the above reflecting power source 52, to be a value at which the current shown in FIG. 3 is saturated, for example, the calculation controlling means 60 controls the reflecting voltage $V_R$ to be −40 V and +40 V. Then, the aforementioned ion current $I_I$ and electron current $I_E$ are measured based on the collector current $I_C$. As described before, it is possible to measure the ion current $I_I$ and electron current $I_E$.

The calculation controlling unit 60 takes in the ion beam current $I_B$ of the ion beam 14 measured by the Faraday cup 56. Due to the foregoing, the calculation controlling means 60 calculates the aforementioned ratios $I_E/I_B$ and $I_I/I_E$ and controls the drawing voltage $V_E$, which is outputted from the drawing power source 58, so that the ratios $I_E/I_B$ and $I_I/I_E$ can be in the above ranges. As described before, it is possible to control the ratio of ions to electrons in the plasma 30 by the drawing voltage $V_E$.

Figure 5:
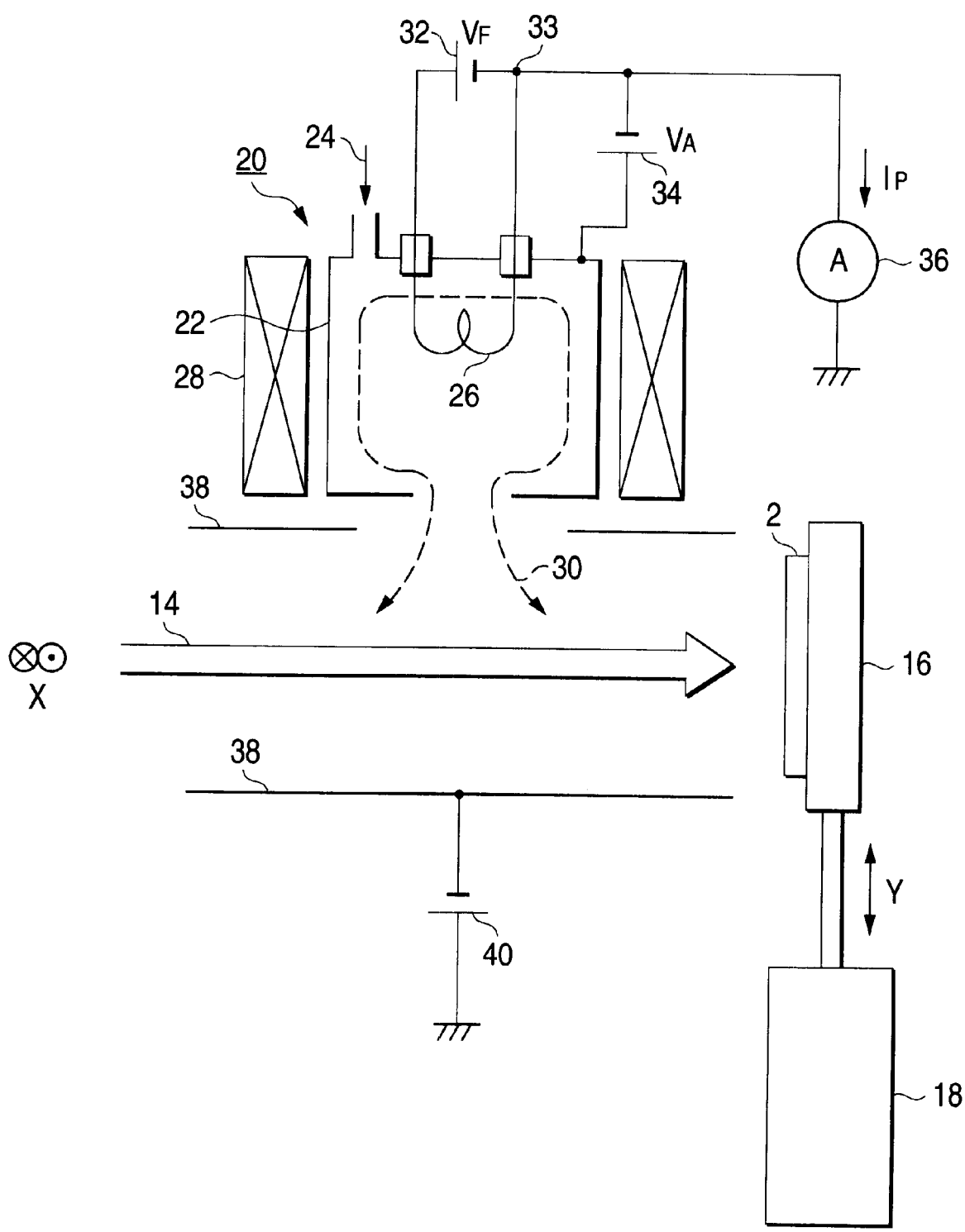
FIG. 5 is a schematic side view showing another example of the ion beam irradiating device to execute the ion beam irradiating method of the present invention.

It is also possible to keep the aforementioned ratios $I_E/I_B$ and $I_I/I_E$ in the above ranges by the device of the embodiment shown in FIG. 5. In this device, the drawing power source 58 described above is not provided. Instead of providing the drawing power source 58, the connecting direction of the filament power source 32 is made to be opposite to that of the conventional example shown in FIG. 6. In this embodiment, the negative electrode of the filament power source 32 and the negative electrode of the arc power source 34 are connected with each other by the connecting section 33, and the connecting section 33 concerned is grounded via the ammeter 36. In this case, the ammeter 36 is arbitrarily provided. The energy analyzer 44 for automatic control use, Faraday cup 56 and calculation controlling unit 60 shown in FIG. 2 are arbitrarily provided.

Figure 6:
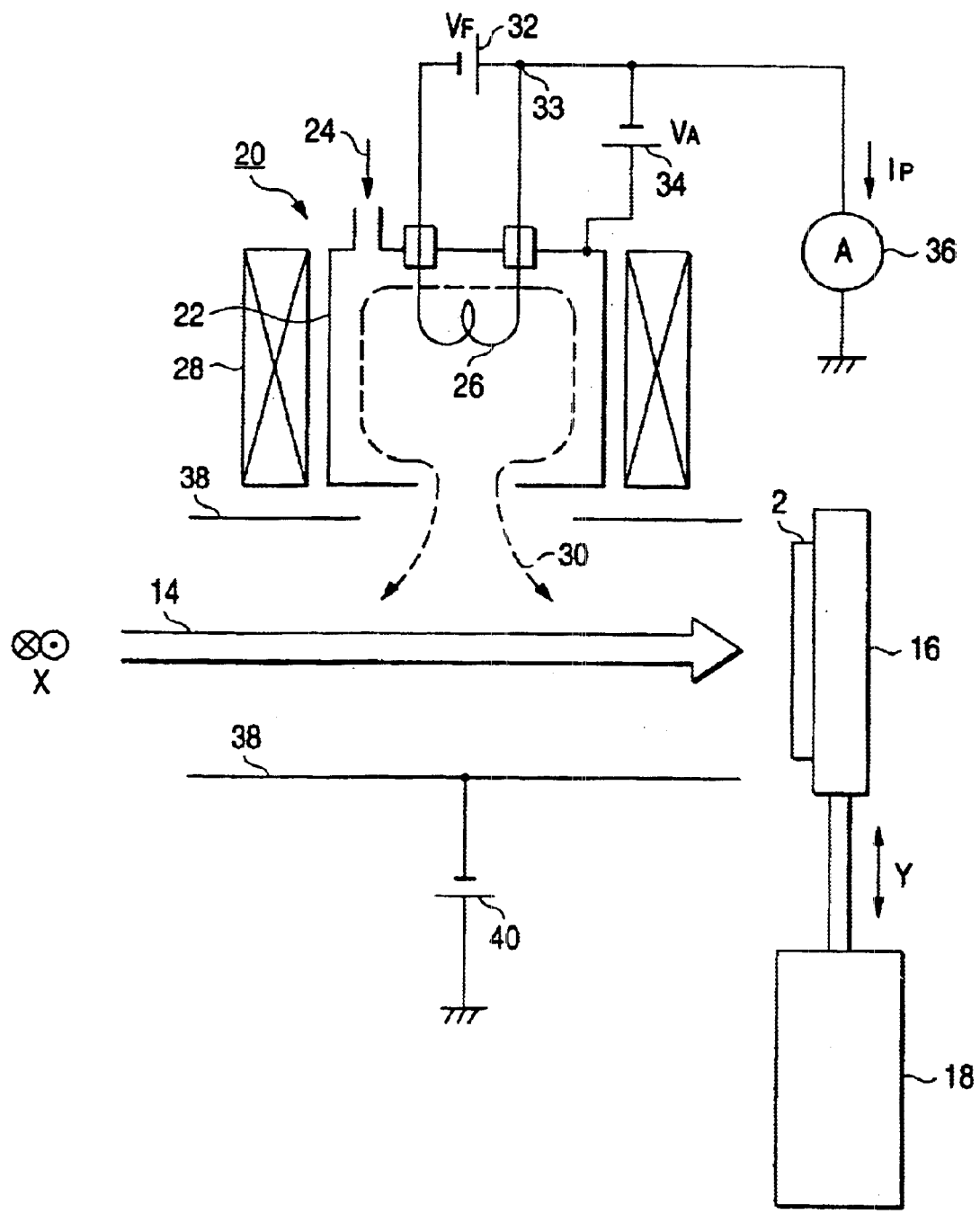
FIG. 6 is a schematic side view showing an example of the conventional ion beam irradiating device.
Figure 7:
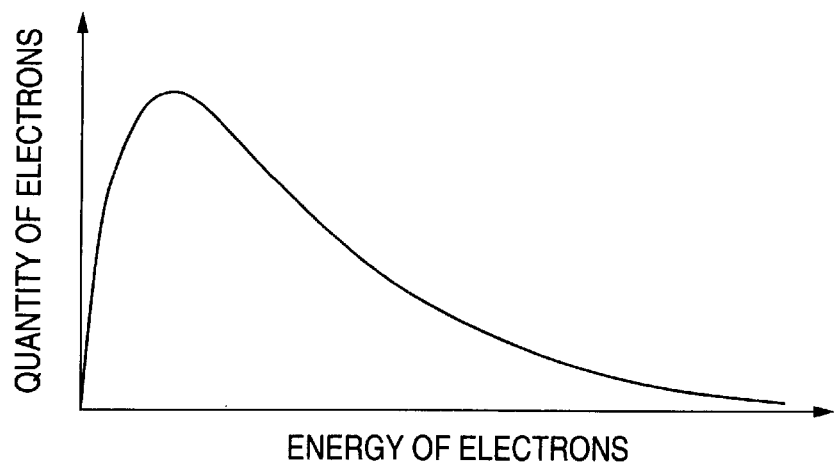
FIG. 7 is a graph showing an example of the energy distribution of electrons in the plasma emitted from the plasma generating device shown in FIGS. 1, 5 and 6.

When the filament power source 32 is connected as shown in FIG. 5, a quantity of ions in the plasma 30 emitted from the plasma generating device 20 can be increased larger than that of the conventional example shown in FIG. 6. To explain it in detail, in order to cause an arc discharge between the filament 26 of the plasma generating device 20 and the plasma generating container 22, it is necessary to provide a difference in the electric potentials which is larger than a predetermined value, between the filament 26 of the plasma generating device 20 and the plasma generating container 22. In the conventional example shown in FIG. 6, this difference in the electric potential becomes maximum at the negative electrode side end of the filament 26, and this difference in the electric potential is the sum $(V_F+V_A)$ of the filament voltage $V_F$ and the arc voltage $V_A$. For example, when the filament voltage $V_F$ is 5 V and the arc voltage $V_A$ is 10 V as described before, the difference in the electric potential is 15 V.

On the other hand, in the embodiment shown in FIG. 5, the difference in the electric potential becomes maximum at the negative electrode side end of the filament 26, however, this difference in the electric potential is the same as the arc voltage $V_A$. Accordingly, when this difference in the electric potential is made to be 15 V which is the same as that of the conventional example, the arc voltage $V_A$ can be made to be 15 V. The filament voltage $V_F$ may be 5 V which is the same as that of the conventional example. Due to the foregoing, the condition of arc discharging in the plasma generating container 22 of the embodiment shown in FIG. 5 becomes the same as that of the conventional example shown in FIG. 6. Therefore, the condition of generating the plasma 30 of the embodiment shown in FIG. 5 becomes the same as that of the conventional example shown in FIG. 6.

However, when the electric potential of the plasma generating container 22 is checked, the electric potential concerned is determined by the arc voltage $V_A$. In the conventional example shown in FIG. 6, the electric potential is +10 V. On the other hand, in the embodiment shown in FIG. 5, the electric potential is +15 V. As explained before in the embodiment shown in FIG. 1, when the electric potential of the plasma generating container 22 is high onto the positive side, ions are easily emitted from the plasma generating container 22. On the contrary, electrons are difficult to be emitted. Accordingly, in FIG. 5, a quantity of ions in the plasma 30 is increased. Due to the foregoing, it becomes possible to increase the above ratio $I_I/I_E$ larger than that of the conventional example shown in FIG. 6. Therefore, it becomes possible to keep the ratio $I_I/I_E$ in the aforementioned range.

When the arc voltage $V_A$ is simply set at 15 V in the conventional example shown in FIG. 6, the following problems may be encountered. A difference in the electric potential between the filament 26 and the plasma generating container 22 is increased (In the case where the filament voltage $V_F$ is 5 V, the difference in the electric potential becomes 20 V at the maximum.). Due to the foregoing, energy of thermoelectrons emitted from the filament 26 is increased. Therefore, electrons, the intensity of energy of which is high, are contained in the plasma 30 and reach the substrate 2, and the negative charging voltage on the substrate surface is increased. In the embodiment shown in FIG. 5, the above problems are not caused.

Figure 8:
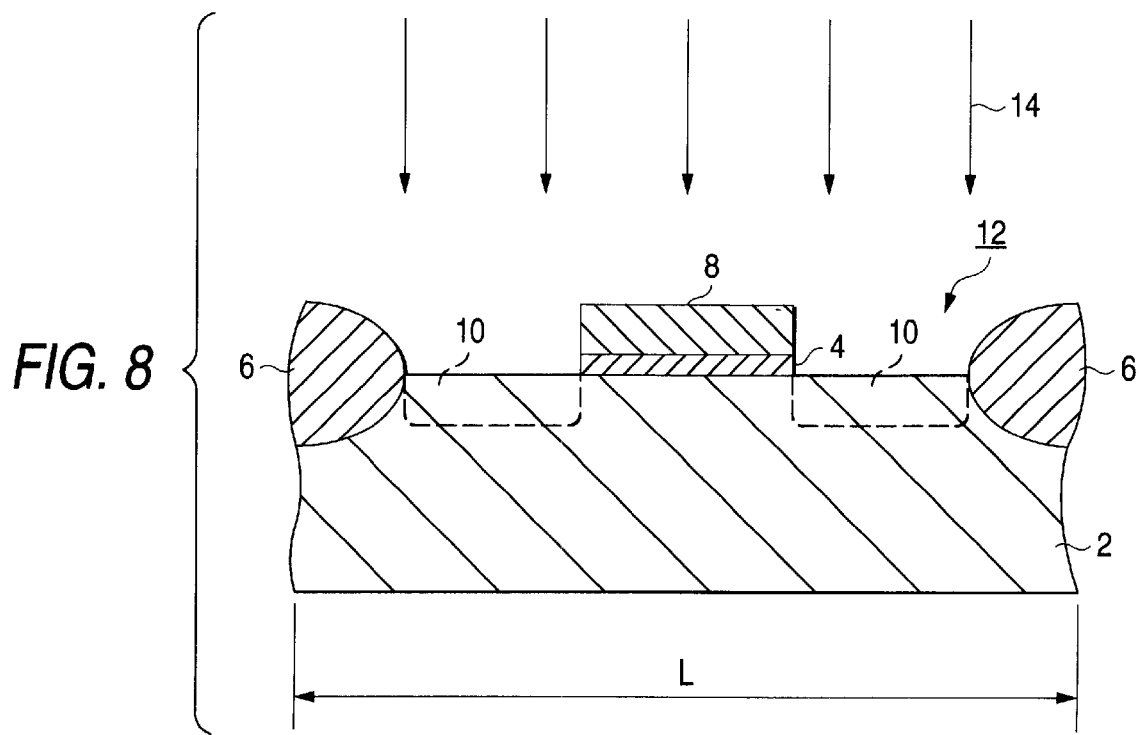
FIG. 8 is an enlarged cross-sectional view showing an outline of an example of the semiconductor device.

The above method of the present invention is preferably applied to a method in which a semiconductor substrate is used as the substrate 2 and irradiated with the ion beam 14 so as to manufacture a semiconductor device. An example of the method of manufacturing the semiconductor device is explained before referring to FIG. 8. When the ion beam 14 is irradiated onto the semiconductor substrate, the plasma 30 emitted from the plasma generating device 20 is supplied to a portion close to the semiconductor substrate, and the above ratios $I_E/I_B$ and $I_I/I_E$ are kept in the above ranges.

Due to the foregoing, for the above reasons, it is possible to reduce the electric charging of the semiconductor substrate surface, so that the charging voltage of the substrate surface can be decreased. For example, the charging voltage of the gate electrode 8 can be reduced during the irradiation of the ion beam 14. Therefore, it is possible to prevent the occurrence of electric breakdown of the semiconductor device 12 while it is being irradiated with the ion beam. Therefore, the yield of the semiconductor device can be enhanced in the process of manufacturing the semiconductor device. For example, as described before, it is also possible to reduce the charging voltage of the gate electrode 8 to a value not higher than 6 V. Therefore, this method is capable of complying with the reduction of the size of the semiconductor device.

In order to effectively utilize the electrons in the plasma 30, it is preferable to provide the reflector electrode 38 and the reflector power source 40, however, it should be noted that the reflector electrode 38 and the reflector power source 40 are not indispensable. The important thing is that the above two ratios are kept in the above ranges.

What is claimed is:

1. A device for irradiating an ion beam comprising:
   an ion beam generating device for generating and irradiating the ion beam onto a substrate;
   a plasma generating device for generating and supplying a plasma close to the substrate so that electric charging on a substrate surface caused by the ion beam irradiation is suppressed; and
   a control unit configured for keeping a ratio of $I_E/I_B$ at a value not lower than 1.8 and also keeping a ratio of $I_I/I_E$ in a range from a value not lower than 0.07 to not higher than 0.7, and for keeping a charging voltage lower than about 6 volts, wherein $I_B$ is an electric current of the ion beam irradiated onto the substrate, $I_I$ is an ion current expressing a quantity of ions in the plasma emitted from the plasma generating device, and $I_E$ is an electron current expressing a quantity of electrons in the plasma.

2. The device of claim 1, wherein the control unit keeps the ratio $I_E/I_B$ at a value not lower than 2.0, and the ratio $I_I/I_E$ in a range from a value not lower than 0.08 to a value not higher than 0.6.

3. The device of claim 1, wherein the control unit includes a drawing power source for impressing selectively positive or negative drawing voltage upon the plasma generating device, an energy analyzer for measuring the quantity of ions and a quantity of electrons in the plasma emitted from the plasma of the plasma generating device, and a control section for controlling the drawing voltage impressed from the drawing power source based on the measuring result from the energy analyzer.

* * * * *